(12) United States Patent
Zordan et al.

(10) Patent No.: US 10,761,435 B2
(45) Date of Patent: Sep. 1, 2020

(54) RETICLE CLAMPING DEVICE

(71) Applicant: ASML Holding N.V., Veldhoven (NL)

(72) Inventors: Enrico Zordan, Norwalk, CT (US); Brandon Adam Evans, Norwalk, CT (US); Daniel Nathan Burbank, Ridgefield, CT (US); Ankur Ramesh Baheti, Stamford, CT (US); Samir A. Nayfeh, Dunn Loring, VA (US)

(73) Assignee: ASML Holding N.V., Veldhoven (NL)

( * ) Notice: Subject to any disclaimer, the term of this patent is extended or adjusted under 35 U.S.C. 154(b) by 0 days.

(21) Appl. No.: 16/484,677

(22) PCT Filed: Jan. 17, 2018

(86) PCT No.: PCT/EP2018/051061
§ 371 (c)(1),
(2) Date: Aug. 8, 2019

(87) PCT Pub. No.: WO2018/145866
PCT Pub. Date: Aug. 16, 2018

(65) Prior Publication Data
US 2019/0391501 A1    Dec. 26, 2019

Related U.S. Application Data

(60) Provisional application No. 62/457,269, filed on Feb. 10, 2017.

(51) Int. Cl.
*G03F 7/20* (2006.01)

(52) U.S. Cl.
CPC ............... *G03F 7/70741* (2013.01)

(58) Field of Classification Search
CPC .................................................. G03F 7/70741
(Continued)

(56) References Cited

U.S. PATENT DOCUMENTS

| 4,924,258 A | 5/1990 | Tsutsui |
| 7,081,946 B2 | 7/2006 | Hagiwara et al. |

(Continued)

FOREIGN PATENT DOCUMENTS

| EP | 1107066 A2 | 6/2001 |
| EP | 2034513 A1 | 3/2009 |

(Continued)

OTHER PUBLICATIONS

International Search Report and Written Opinion of the International Searching Authority directed to related International Patent Application No. PCT/EP2018/051061, dated May 14, 2018; 11 pages.

(Continued)

*Primary Examiner* — Hung Nguyen
(74) *Attorney, Agent, or Firm* — Sterne, Kessler, Goldstein & Fox P.L.L.C.

(57) ABSTRACT

Systems and methods are disclosed that provide a support system in the Z direction for patterning devices that can function under high acceleration and deceleration with minimal effect on travel and hysteresis in the X and Y directions. A reticle clamping system includes a support device and a holding device. The holding device is configured to releasably couple a reticle to the support device. The holding device includes a plurality of burls. The reticle clamping system further includes a metallic support system coupled to the support device. The metallic support system provides a vacuum path from a vacuum channel to the holding device.

20 Claims, 11 Drawing Sheets

(58) Field of Classification Search
USPC .................................................. 355/72–76
See application file for complete search history.

(56) References Cited

U.S. PATENT DOCUMENTS

| | | | |
|---|---|---|---|
| 7,133,120 | B2 | 11/2006 | Zaal et al. |
| 7,307,698 | B2 | 12/2007 | Miyajima et al. |
| 8,976,336 | B2 | 3/2015 | Nayfeh et al. |
| 2006/0279721 | A1 | 12/2006 | Baggen et al. |
| 2007/0178704 | A1* | 8/2007 | Loopstra ............... G03F 7/707 438/708 |
| 2007/0258081 | A1 | 11/2007 | Baggen et al. |
| 2007/0268476 | A1 | 11/2007 | Phillips et al. |
| 2008/0291411 | A1 | 11/2008 | Phillips |
| 2009/0033907 | A1 | 2/2009 | Watson et al. |
| 2010/0103390 | A1 | 4/2010 | Lafarre et al. |
| 2011/0007297 | A1 | 1/2011 | Koike |
| 2012/0002187 | A1* | 1/2012 | Zordan ................. G03F 7/707 355/73 |

FOREIGN PATENT DOCUMENTS

| | | |
|---|---|---|
| JP | S 64-033927 A | 2/1989 |
| JP | 2001-185607 A | 7/2001 |
| JP | 2005-235890 A | 9/2005 |
| JP | 2005-328045 A | 11/2005 |
| JP | 2006-041302 A | 2/2006 |
| JP | 2006-339347 A | 12/2006 |
| JP | 2009-537966 A | 10/2009 |
| JP | 2011-520245 A | 7/2011 |
| JP | 2017-135331 A | 8/2017 |
| NL | 2006562 A | 11/2011 |
| WO | WO 02/065519 A1 | 8/2002 |
| WO | WO 2007/136123 A1 | 11/2007 |

OTHER PUBLICATIONS

International Preliminary Report on Patentability directed to related International Patent Application No. PCT/EP2018/051061, dated Aug. 13, 2019; 9 pages.

Japanese Notice of Reasons for Refusal directed to related Japanese Patent Application No. 2019-540433, dated Jun. 25, 2020; 11 pages.

Japanese Search Report directed to related Japanese Patent Application No. 2019-540433, dated Jun. 17, 2020; 20 pages.

* cited by examiner

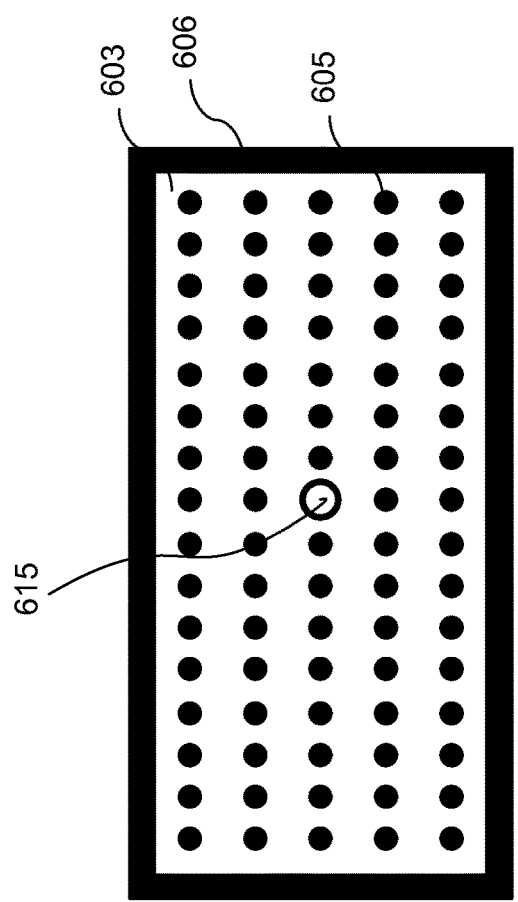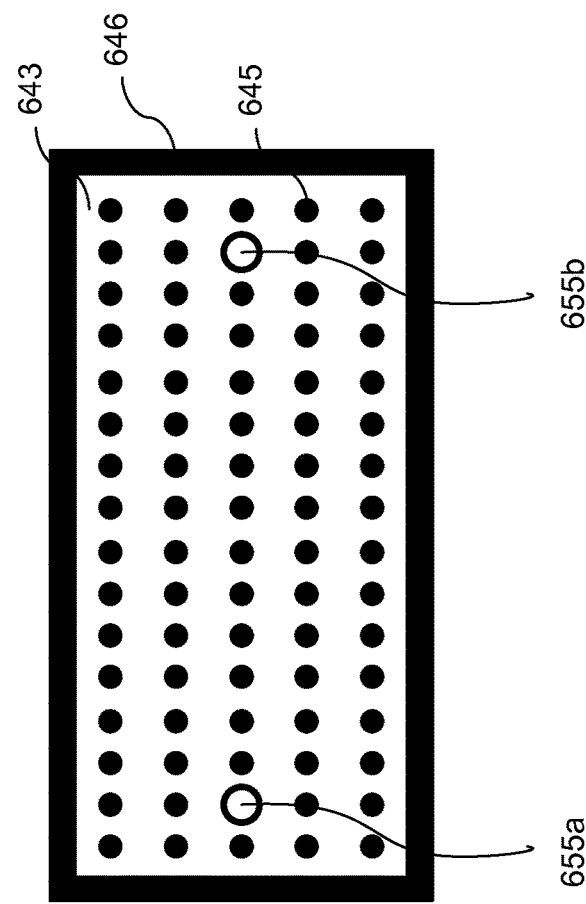

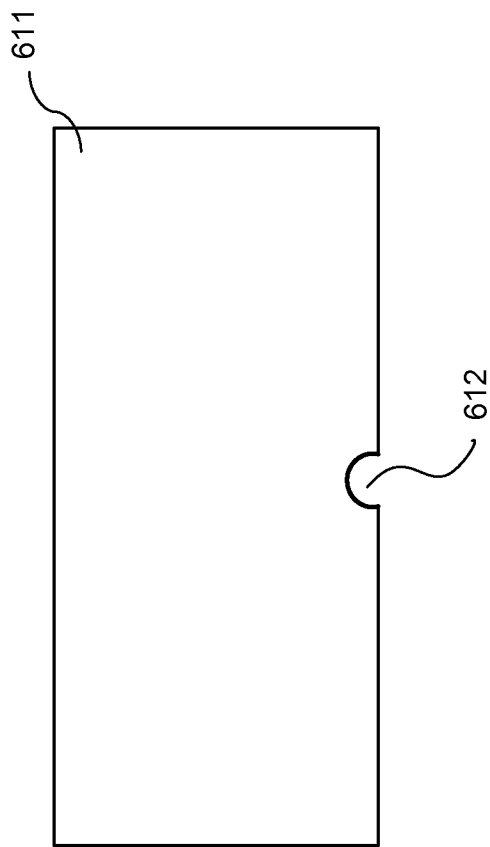
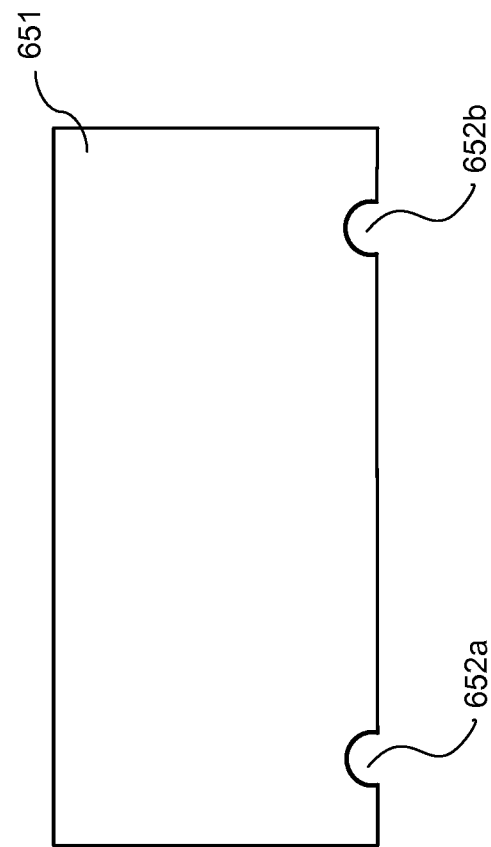

RETICLE CLAMPING DEVICE

CROSS-REFERENCE TO RELATED APPLICATIONS

This application claims priority of U.S. Provisional Patent Application No. 62/457,269, which was filed on Feb. 10, 2017, and which is incorporated herein in its entirety by reference.

FIELD

The present disclosure relates to a reticle clamping device that may be used, for example, in a lithographic apparatus.

BACKGROUND

A lithographic apparatus is a machine that applies a desired pattern onto a target portion of a substrate. A lithographic apparatus can be used, for example, in the manufacturing of integrated circuits (ICs). In that circumstance, a patterning device, which is alternatively referred to as a mask or a reticle, may be used to generate a circuit pattern corresponding to an individual layer of the IC, and this pattern can be imaged onto a target portion (e.g., comprising part of, one or several dies) on a substrate (e.g., a silicon wafer) that has a layer of radiation-sensitive material (resist). In general, a single substrate will contain a network of adjacent target portions that are successively exposed. Known lithographic apparatuses include so-called steppers, in which each target portion is irradiated by exposing an entire pattern onto the target portion in one go, and so-called scanners, in which each target portion is irradiated by scanning the pattern through the beam in a given direction (the "scanning"-direction) while synchronously scanning the substrate parallel or anti parallel to this direction.

To increase production rate of scanned patterns, a patterning device is scanned at constant velocity across a projection lens, back and forth along a scan direction. Therefore, starting from rest, the reticle quickly accelerates to reach the scan velocity, and then at the end of the scan, it quickly decelerates to zero, reverses direction, and accelerates in the opposite direction to reach the scan velocity. The acceleration/deceleration rate is, for example, 15 times the acceleration of gravity. There is no inertial force on the reticle during the constant velocity portion of the scan. However, the large inertial force encountered during the acceleration and deceleration portions of the scan, for example, 60 Newtons (e.g., =0.4 kg of reticle mass×150 m/sec2 of acceleration) can lead to slippage of the reticle. Such slippage can result in a misaligned device pattern on a substrate.

Further, the reticle is constrained in the Z axis direction (i.e., the gravitational direction) by the use of multiple supports. The function of such supports is to position the reticle in the Z direction while not affecting movement in the X and Y directions. In some configurations, the Z supports entail the use of an adhesive to affix a clamp that holds the reticle in place with the remaining support structure, e.g., a chuck. However, the use of adhesive results in significant XY stiffness and large hysteresis issues. Such hysteresis occurs during the acceleration and deceleration portions of the scan when the Z supports, attached to a clamp with adhesive are subject to XY shearing forces where the adhesive, while stiff, exhibits some amount of flexibility and hysteresis in the XY directions. In addition, as these Z supports have a non-zero stiffness factor they also generate a high stress point at the interface of the reticle and clamp in the surrounding regions, thus causing microslip and corresponding overlay issues.

SUMMARY

Accordingly, there is a need for methods and systems that provide a support system in the Z direction for patterning devices that can function under high acceleration and deceleration with minimal effect on travel and hysteresis in the X and Y directions.

According to an embodiment, a reticle clamping system includes a support device and a holding device. The holding device is configured to releasably couple a reticle to the support device. The holding device includes a plurality of burls. The reticle clamping system further includes a metallic support system coupled to the support device. The metallic support system provides a vacuum path from a vacuum channel to the holding device.

In another embodiment, a lithographic apparatus includes an illumination optical system configured to illuminate a pattern of a patterning device and a projection system configured to project an image of the pattern on to a target portion of a substrate. The apparatus further includes a reticle clamping system. The reticle clamping system includes a support device and a holding device. The holding device is configured to releasably couple a reticle to the support device. The holding device includes a plurality of burls. The reticle clamping system further includes a metallic support system coupled to the support device. The metallic support system provides a vacuum path from a vacuum channel to the holding device.

In yet another embodiment, a method for supporting a patterning device includes holding the patterning device using a plurality of burls on a holding device and supporting the holding device using a support device. The method further includes providing a vacuum path from a vacuum channel to the holding device through a metallic support system.

BRIEF DESCRIPTION OF THE DRAWINGS/FIGURES

The accompanying drawings, which are incorporated herein and form part of the specification, illustrate the present disclosure and, together with the description, further serve to explain the principles of the disclosure and to enable a person skilled in the relevant art(s) to make and use the disclosure.

FIGS. 6A and 6B are schematics of top view of holding devices, according to an embodiment of the disclosure.

FIGS. 6C and 6D are schematics of top view of second support device portions, according to an embodiment of the disclosure.

Figure 1A:
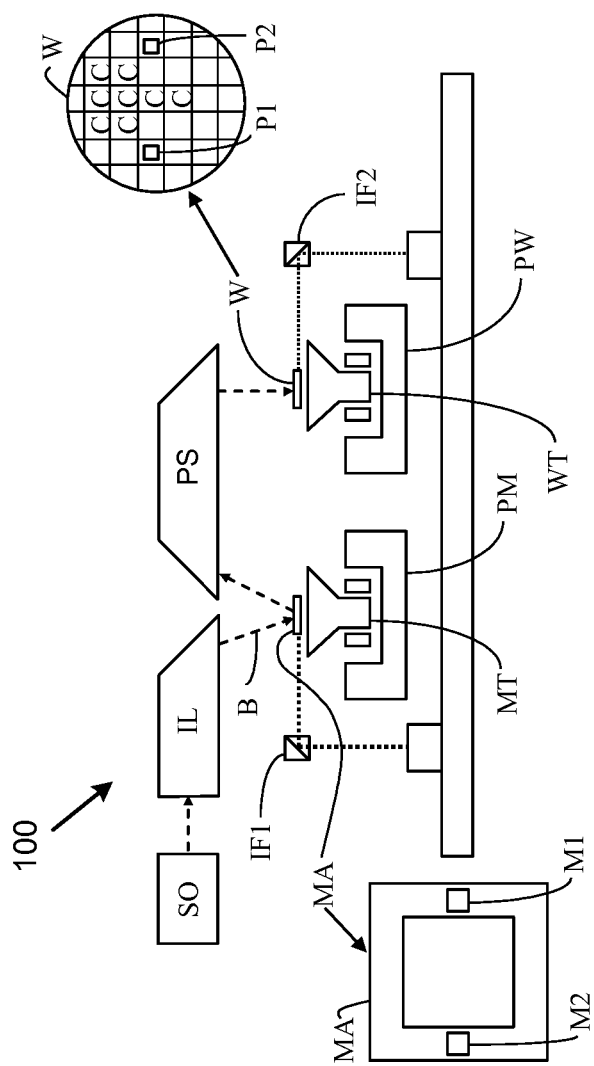
FIG. 1A is a schematic illustration of a reflective lithographic apparatus according to an embodiment of the disclosure.

The features and advantages of the present disclosure will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number. Unless otherwise indicated, the drawings provided throughout the disclosure should not be interpreted as to-scale drawings.

DETAILED DESCRIPTION

This specification discloses one or more embodiments that incorporate the features of this disclosure. The disclosed embodiment(s) merely exemplify the disclosure. The scope of the disclosure is not limited to the disclosed embodiment(s). The disclosure is defined by the claims appended hereto.

The embodiment(s) described, and references in the specification to "one embodiment," "an embodiment," "an example embodiment," etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Before describing such embodiments in more detail, however, it is instructive to present an example environment in which embodiments of the present disclosure may be implemented.

Figure 1B:
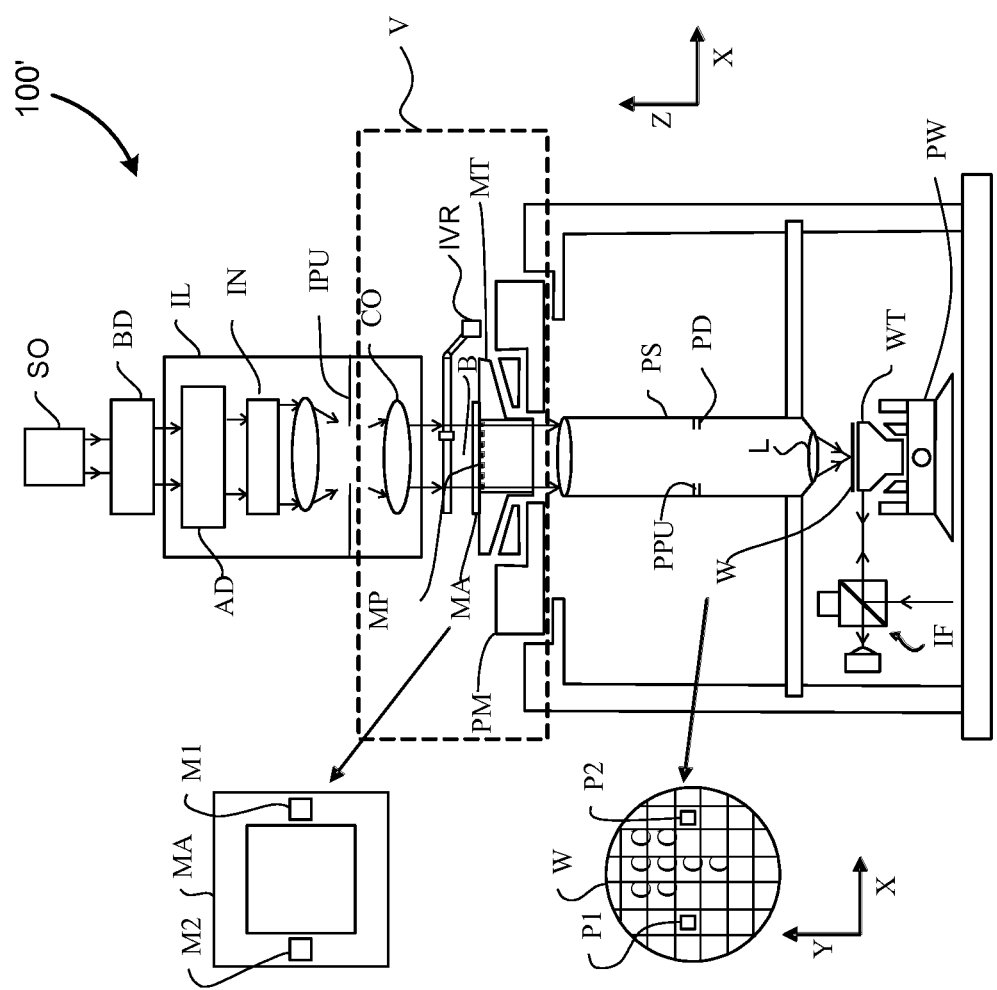
FIG. 1B is a schematic illustration of a transmissive lithographic apparatus according to an embodiment of the disclosure.

FIGS. 1A and 1B are schematic illustrations of a lithographic apparatus 100 and lithographic apparatus 100', respectively, in which embodiments of the present disclosure may be implemented. Lithographic apparatus 100 and lithographic apparatus 100' each include the following: an illumination system (illuminator) IL configured to condition a radiation beam B (for example, deep ultra violet or extreme ultra violet radiation); a support structure (for example, a mask table) MT configured to support a patterning device (for example, a mask, a reticle, or a dynamic patterning device) MA and connected to a first positioner PM configured to accurately position the patterning device MA; and, a substrate table (for example, a wafer table) WT configured to hold a substrate (for example, a resist coated wafer) W and connected to a second positioner PW configured to accurately position the substrate W. Lithographic apparatus 100 and 100' also have a projection system PS configured to project a pattern imparted to the radiation beam B by patterning device MA onto a target portion (for example, comprising one or more dies) C of the substrate W. In lithographic apparatus 100, the patterning device MA and the projection system PS are reflective. In lithographic apparatus 100', the patterning device MA and the projection system PS are transmissive.

The illumination system IL may include various types of optical components, such as refractive, reflective, catadioptric, magnetic, electromagnetic, electrostatic, or other types of optical components, or any combination thereof, for directing, shaping, or controlling the radiation beam B.

The support structure MT holds the patterning device MA in a manner that depends on the orientation of the patterning device MA with respect to a reference frame, the design of at least one of the lithographic apparatus 100 and 100', and other conditions, such as whether or not the patterning device MA is held in a vacuum environment. The support structure MT may use mechanical, vacuum, electrostatic, or other clamping techniques to hold the patterning device MA. The support structure MT can be a frame or a table, for example, which can be fixed or movable, as required. By using sensors, the support structure MT can ensure that the patterning device MA is at a desired position, for example, with respect to the projection system PS.

The term "patterning device" MA should be broadly interpreted as referring to any device that can be used to impart a radiation beam B with a pattern in its cross-section, such as to create a pattern in the target portion C of the substrate W. The pattern imparted to the radiation beam B can correspond to a particular functional layer in a device being created in the target portion C to form an integrated circuit.

The patterning device MA may be transmissive (as in lithographic apparatus 100' of FIG. 1B) or reflective (as in lithographic apparatus 100 of FIG. 1A). Examples of patterning devices MA include reticles, masks, programmable mirror arrays, and programmable LCD panels. Masks are well known in lithography, and include mask types such as binary, alternating phase shift, and attenuated phase shift, as well as various hybrid mask types. An example of a programmable mirror array employs a matrix arrangement of small mirrors, each of which can be individually tilted so as to reflect an incoming radiation beam in different directions. The tilted mirrors impart a pattern in the radiation beam B which is reflected by a matrix of small mirrors.

The term "projection system" PS can encompass any type of projection system, including refractive, reflective, catadioptric, magnetic, electromagnetic and electrostatic optical systems, or any combination thereof, as appropriate for the exposure radiation being used, or for other factors, such as the use of an immersion liquid on the substrate W or the use of a vacuum. A vacuum environment can be used for EUV or electron beam radiation since other gases can absorb too much radiation or electrons. A vacuum environment can therefore be provided to the whole beam path with the aid of a vacuum wall and vacuum pumps.

Lithographic apparatus 100 and/or lithographic apparatus 100' can be of a type having two (dual stage) or more substrate tables WT (and/or two or more mask tables). In such "multiple stage" machines, the additional substrate tables WT can be used in parallel, or preparatory steps can be carried out on one or more tables while one or more other substrate tables WT are being used for exposure. In some situations, the additional table may not be a substrate table WT.

Referring to FIGS. 1A and 1B, the illuminator IL receives a radiation beam from a radiation source SO. The source SO and the lithographic apparatus 100, 100' can be separate physical entities, for example, when the source SO is an excimer laser. In such cases, the source SO is not considered to form part of the lithographic apparatus 100 or 100', and the radiation beam B passes from the source SO to the illuminator IL with the aid of a beam delivery system BD (in FIG. 1B) including, for example, suitable directing mirrors and/or a beam expander. In other cases, the source SO can be an integral part of the lithographic apparatus 100, 100'— for example when the source SO is a mercury lamp. The source SO and the illuminator IL, together with the beam delivery system BD, if required, can be referred to as a radiation system.

The illuminator IL can include an adjuster AD (in FIG. 1B) for adjusting the angular intensity distribution of the radiation beam. Generally, at least the outer and/or inner radial extent (commonly referred to as "σ-outer" and "σ-inner," respectively) of the intensity distribution in a pupil plane of the illuminator can be adjusted. In addition, the illuminator IL can comprise various other components (in FIG. 1B), such as an integrator IN and a condenser CO. The illuminator IL can be used to condition the radiation beam B to have a desired uniformity and intensity distribution in its cross section.

Referring to FIG. 1A, the radiation beam B is incident on the patterning device (for example, mask) MA, which is held on the support structure (for example, mask table) MT, and is patterned by the patterning device MA. In lithographic apparatus 100, the radiation beam B is reflected from the patterning device (for example, mask) MA. After being reflected from the patterning device (for example, mask) MA, the radiation beam B passes through the projection system PS, which focuses the radiation beam B onto a target portion C of the substrate W. With the aid of the second positioner PW and position sensor IF2 (for example, an interferometric device, linear encoder, or capacitive sensor), the substrate table WT can be moved accurately (for example, so as to position different target portions C in the path of the radiation beam B). Similarly, the first positioner PM and another position sensor IF1 can be used to accurately position the patterning device (for example, mask) MA with respect to the path of the radiation beam B. Patterning device (for example, mask) MA and substrate W can be aligned using mask alignment marks M1, M2 and substrate alignment marks P1, P2.

Referring to FIG. 1B, the radiation beam B is incident on the patterning device (for example, mask MA), which is held on the support structure (for example, mask table MT), and is patterned by the patterning device. Having traversed the mask MA, the radiation beam B passes through the projection system PS, which focuses the beam onto a target portion C of the substrate W. The projection system has a pupil PPU conjugate to an illumination system pupil IPU. Portions of radiation emanate from the intensity distribution at the illumination system pupil IPU and traverse a mask pattern without being affected by diffraction at a mask pattern and create an image of the intensity distribution at the illumination system pupil IPU.

With the aid of the second positioner PW and position sensor IF (for example, an interferometric device, linear encoder, or capacitive sensor), the substrate table WT can be moved accurately (for example, so as to position different target portions C in the path of the radiation beam B). Similarly, the first positioner PM and another position sensor (not shown in FIG. 1B) can be used to accurately position the mask MA with respect to the path of the radiation beam B (for example, after mechanical retrieval from a mask library or during a scan).

In general, movement of the mask table MT can be realized with the aid of a long-stroke module (coarse positioning) and a short-stroke module (fine positioning), which form part of the first positioner PM. Similarly, movement of the substrate table WT can be realized using a long-stroke module and a short-stroke module, which form part of the second positioner PW. In the case of a stepper (as opposed to a scanner), the mask table MT can be connected to a short-stroke actuator only or can be fixed. Mask MA and substrate W can be aligned using mask alignment marks M1, M2, and substrate alignment marks P1, P2. Although the substrate alignment marks (as illustrated) occupy dedicated target portions, they can be located in spaces between target portions (known as scribe-lane alignment marks). Similarly, in situations in which more than one die is provided on the mask MA, the mask alignment marks can be located between the dies.

Mask table MT and patterning device MA can be in a vacuum chamber, where an in-vacuum robot IVR can be used to move patterning devices such as a mask in and out of vacuum chamber. Alternatively, when mask table MT and patterning device MA are outside of the vacuum chamber, an out-of-vacuum robot can be used for various transportation operations, similar to the in-vacuum robot IVR. Both the in-vacuum and out-of-vacuum robots need to be calibrated for a smooth transfer of any payload (e.g., mask) to a fixed kinematic mount of a transfer station.

The lithographic apparatus 100 and 100' can be used in at least one of the following modes:

1. In step mode, the support structure (for example, mask table) MT and the substrate table WT are kept essentially stationary, while an entire pattern imparted to the radiation beam B is projected onto a target portion C at one time (i.e., a single static exposure). The substrate table WT is then shifted in the X and/or Y direction so that a different target portion C can be exposed.

2. In scan mode, the support structure (for example, mask table) MT and the substrate table WT are scanned synchronously while a pattern imparted to the radiation beam B is projected onto a target portion C (i.e., a single dynamic exposure). The velocity and direction of the substrate table WT relative to the support structure (for example, mask table) MT can be determined by the (de-)magnification and image reversal characteristics of the projection system PS.

3. In another mode, the support structure (for example, mask table) MT is kept substantially stationary holding a programmable patterning device, and the substrate table WT is moved or scanned while a pattern imparted to the radiation beam B is projected onto a target portion C. A pulsed radiation source SO can be employed and the programmable patterning device is updated as required after each movement of the substrate table WT or in between successive radiation pulses during a scan. This mode of operation can be readily applied to maskless lithography that utilizes a programmable patterning device, such as a programmable mirror array.

Combinations and/or variations on the described modes of use or entirely different modes of use can also be employed.

In a further embodiment, lithographic apparatus 100 includes an extreme ultraviolet (EUV) source, which is configured to generate a beam of EUV radiation for EUV lithography. In general, the EUV source is configured in a radiation system, and a corresponding illumination system is configured to condition the EUV radiation beam of the EUV source.

Figure 2:
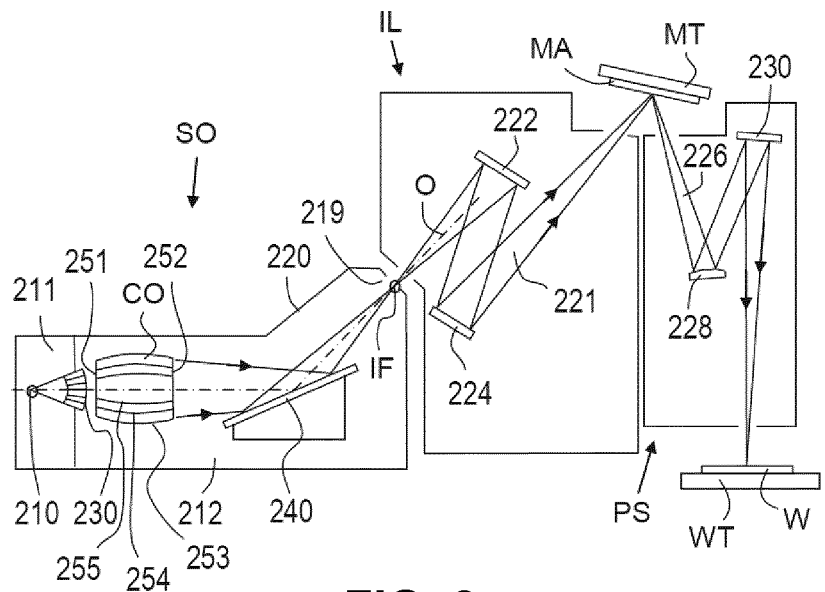
FIG. 2 is a more detailed schematic illustration of the reflective lithographic apparatus, according to an embodiment of the disclosure.

FIG. 2 shows the lithographic apparatus 100 in more detail, including the source collector apparatus SO, the illumination system IL, and the projection system PS. The source collector apparatus SO is constructed and arranged such that a vacuum environment can be maintained in an enclosing structure 220 of the source collector apparatus SO. An EUV radiation emitting plasma 210 may be formed by a discharge produced plasma source. EUV radiation may be produced by a gas or vapor, for example Xe gas, Li vapor or Sn vapor in which the very hot plasma 210 is created to emit radiation in the EUV range of the electromagnetic spectrum. The very hot plasma 210 is created by, for example, an electrical discharge causing an at least partially ionized plasma. Partial pressures of, for example, 10 Pa of Xe, Li, Sn vapor or any other suitable gas or vapor may be required for efficient generation of the radiation. In an embodiment, a plasma of excited tin (Sn) is provided to produce EUV radiation.

The radiation emitted by the hot plasma 210 is passed from a source chamber 211 into a collector chamber 212 via an optional gas barrier or contaminant trap 230 (in some cases also referred to as contaminant barrier or foil trap) which is positioned in or behind an opening in source chamber 211. The contaminant trap 230 may include a channel structure. Contamination trap 230 may also include a gas barrier or a combination of a gas barrier and a channel structure. The contaminant trap or contaminant barrier 230 further indicated herein at least includes a channel structure, as known in the art.

The collector chamber 212 may include a radiation collector CO which may be a so-called grazing incidence collector. Radiation collector CO has an upstream radiation collector side 251 and a downstream radiation collector side 252. Radiation that traverses collector CO can be reflected off a grating spectral filter 240 to be focused in a virtual source point IF. The virtual source point IF is commonly referred to as the intermediate focus, and the source collector apparatus is arranged such that the intermediate focus IF is located at or near an opening 219 in the enclosing structure 220. The virtual source point IF is an image of the radiation emitting plasma 210. Grating spectral filter 240 is used in particular for suppressing infra-red (IR) radiation.

Subsequently the radiation traverses the illumination system IL, which may include a facetted field mirror device 222 and a facetted pupil mirror device 224 arranged to provide a desired angular distribution of the radiation beam 221, at the patterning device MA, as well as a desired uniformity of radiation intensity at the patterning device MA. Upon reflection of the beam of radiation 221 at the patterning device MA, held by the support structure MT, a patterned beam 226 is formed and the patterned beam 226 is imaged by the projection system PS via reflective elements 228, 230 onto a substrate W held by the wafer stage or substrate table WT.

More elements than shown may generally be present in illumination optics unit IL and projection system PS. The grating spectral filter 240 may optionally be present, depending upon the type of lithographic apparatus. Further, there may be more mirrors present than those shown in the FIGs., for example there may be 1-6 additional reflective elements present in the projection system PS than shown in FIG. 2.

Collector optic CO, as illustrated in FIG. 2, is depicted as a nested collector with grazing incidence reflectors 253, 254 and 255, just as an example of a collector (or collector mirror). The grazing incidence reflectors 253, 254 and 255 are disposed axially symmetric around an optical axis O and a collector optic CO of this type is preferably used in combination with a discharge produced plasma source, often called a DPP source.

Figure 3:
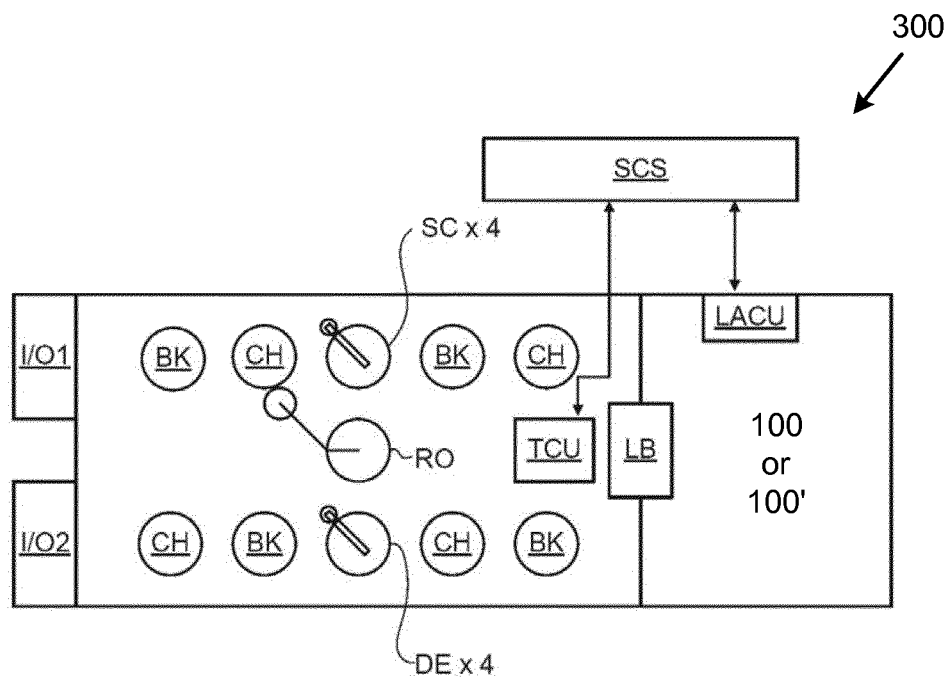
FIG. 3 is a schematic illustration of a lithographic cell, according to an embodiment of the disclosure.

FIG. 3 shows a lithographic cell 300, also sometimes referred to a lithocell or cluster. Lithographic apparatus 100 or 100' may form part of lithographic cell 300. Lithographic cell 300 may also include apparatus to perform pre- and post-exposure processes on a substrate. Conventionally these include spin coaters SC to deposit resist layers, developers DE to develop exposed resist, chill plates CH and bake plates BK. A substrate handler, or robot, RO picks up substrates from input/output ports I/O1, I/O2, moves them between the different process apparatus and delivers then to the loading bay LB of the lithographic apparatus. These devices, which are often collectively referred to as the track, are under the control of a track control unit TCU which is itself controlled by the supervisory control system SCS, which also controls the lithographic apparatus via lithography control unit LACU. Thus, the different apparatus can be operated to maximize throughput and processing efficiency.

Figure 4:
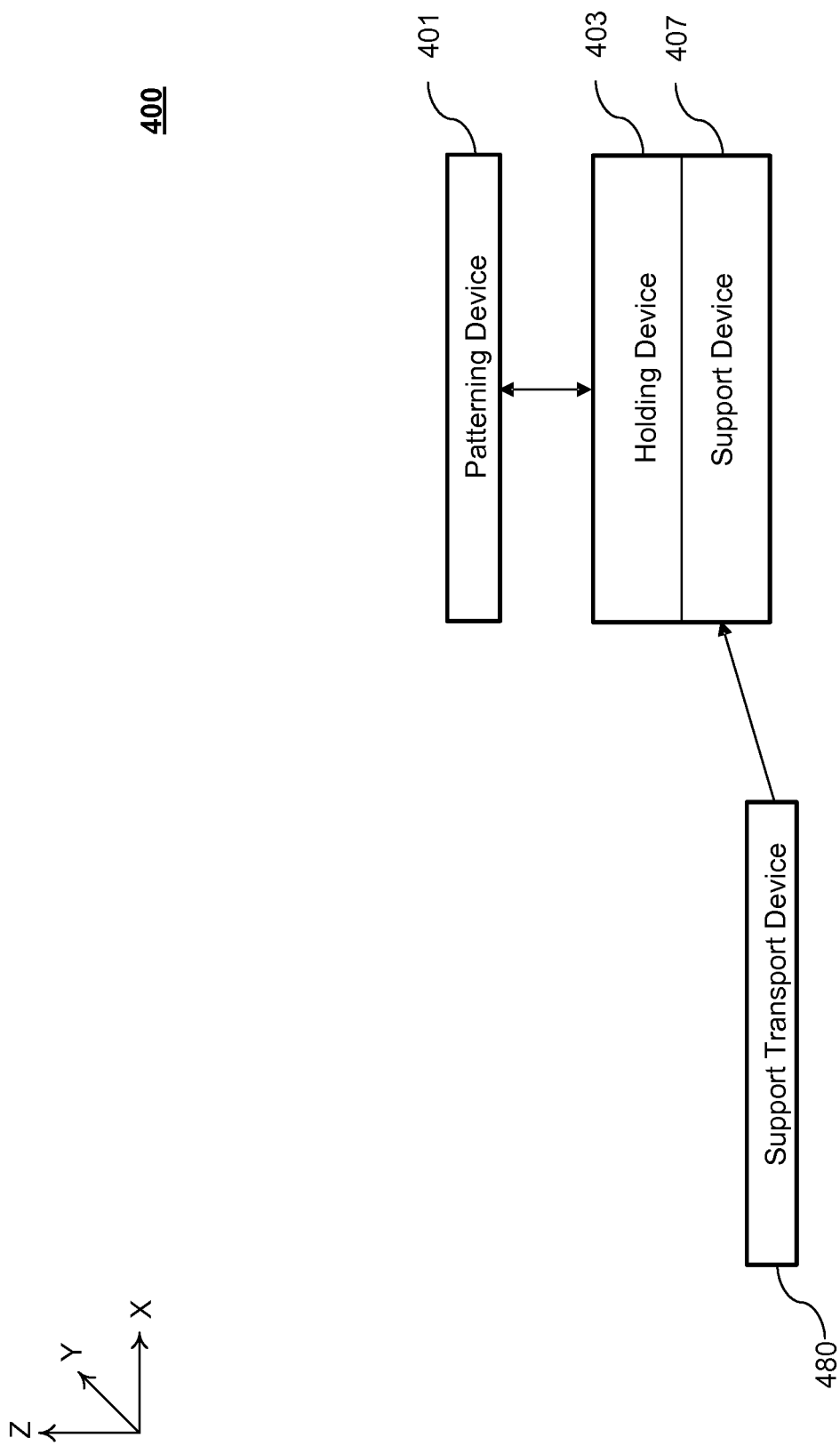
FIG. 4 is a schematic diagram of a reticle clamping system, according to an embodiment of the disclosure.

FIG. 4 is a schematic diagram of a reticle clamping system 400, according to an embodiment.

In this example, reticle clamping system 400 includes a holding device 403 to hold a patterning device 401, a support device 407, and a support transport device 480. Holding device 403 securely holds patterning device 401. Support device 407 supports holding device 403. Support transport device 480 transports support device 407. Support transport device 480 applies an accelerating force to support device 407 during an accelerating portion of a scanning motion profile and a decelerating force to support device 407 during a decelerating portion of a scanning motion profile. Holding device 403 holds patterning device 401, such that during a constant velocity portion of a scanning motion profile there is no displacement of the patterned mask relative to support transport device 480.

In one example, patterning device 401 (e.g., a mask or reticle) is releasably held to support device 407 by holding device 403 (e.g., that uses a vacuum). Support device 407 can be configured to move in an X-direction, a Y-direction, a Z-direction, and Rx, Ry, and Rz rotations when support transport device 480 is being controlled. Support transport device 480 can be coupled to support device 407, e.g., using any bonding technique (such as, but not limited to, an adhesive component, laser or ultrasonic welding, chemical boding, or a combination thereof), such that support transport device 480 provides sufficient force to accelerate support device 407 during an acceleration portion of a scanning motion profile, and sufficient force to decelerate support device 407 during a deceleration portion of a scanning motion profile.

In one example, support transport device 480 may move support device 407 with holding device 403 and the releasably held patterning device 401, at a high rate of speed and a high rate of acceleration or deceleration. High acceleration and deceleration can generate a lateral shearing force between holding device 403 and support device 407. The shearing force can cause slippage of holding device 403 and patterning device 401, relative to support device 407. This lateral force also causes a mechanical hysteresis behavior producing overlay error as the position of patterning device 401 relative to support transport device 480 is not consistent or reproducible.

Figure 5:
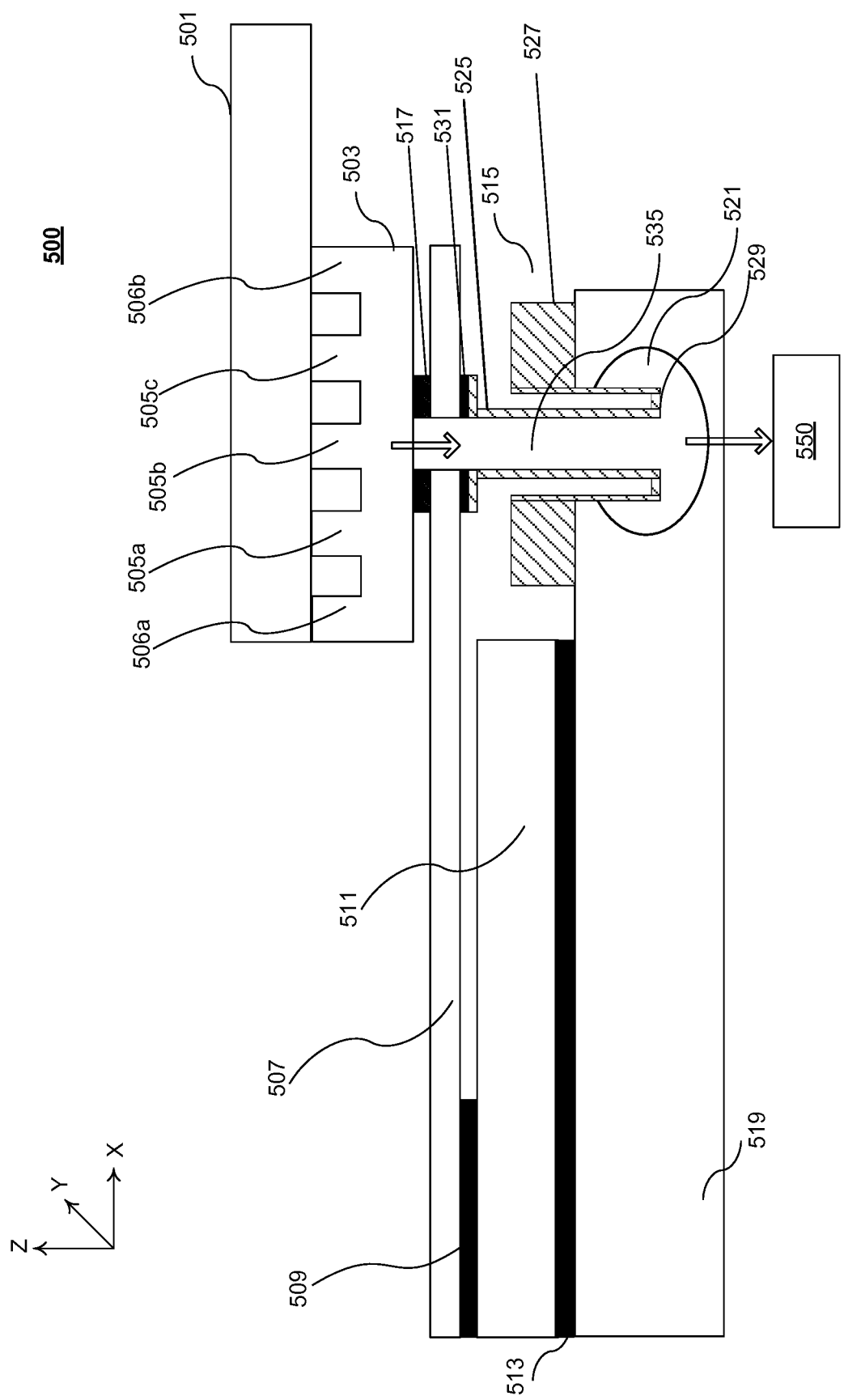
FIG. 5 is a schematic of a cross-sectional view of a reticle clamping system including a support system, according to an embodiment of the disclosure.

FIG. 5 illustrates a schematic of a cross-sectional view of a reticle clamping system 500 including a support system, according to an embodiment of the disclosure.

In this example, reticle clamping system 500 includes a holding device 503 to hold patterning device 501, support device including first and second support device portions 507 and 511, a support transport device 519, support system 515. The holding device 503, support device portions 507 and 511, support transport device 519, and support system 515 are coupled together, for example, using any bonding technique (such as, but not limited to, adhesives 509, 513, 517, and 531, laser or ultrasonic welding, chemical boding, or a combination thereof).

In an example, patterning device 501 (e.g., a mask or reticle) is coupled to holding device 503 by a variety of means (e.g., vacuum, adhesive, electo-magnetic, electrostatic, and combinations thereof). Holding device 503 is coupled to first support device portion 507, for example with adhesive 517. In one example, first support device portion 507 can provide the stiffness and positioning in the X and Y directions while allowing compliance in the Z direction so to not deform patterning device 501. In other words, first support device portion 507 can be designed to be stiff in the X and Y directions while flexible in the Z direction.

First support device portion 507 is coupled to the second support device portion 511, for example with adhesive 509. However, it is noted that other designs can be used to couple first and second support device portions 507 and 511.

Second support device portion 511 is further coupled to support transport device 519, for example using adhesive 513. In one example, one or more of adhesives 509, 513, 517, and 531 may comprise one or more of Araldite® 2030, Epo-tek® 310M, or the like. However, it is noted that other adhesives can also be used. Additionally or alternatively, the holding device 503, support device portions 507 and 511, support transport device 519, and support system 515 can be coupled together using a bonding technique.

According to some embodiments, holding device 503 of reticle clamping system 500 can include a plurality of burls 505a-505c. In one example, patterning device 501 is coupled to the plurality of burls 505a-505c of holding device 503, which are configured to releasably hold patterning device 501 using, for example, vacuum. Although only three burls are shown in FIG. 5, it is noted that the plurality of burls 505a-505c can include any number of burls. In some embodiments, using the plurality of burls 505a-505c can improve shear stress uniformity. In one example, the plurality of burls 505a-505c can have a design and a pattern such that the plurality of burls can create a distributed, uniform and compliant layer at the contact surface between patterning device 501 and holding device 503. Further, the height, the shape, the size, and/or the stiffness of the plurality of burls 505a-505c can be optimized to create a distributed, uniform and compliant layer at the contact surface. According to some embodiments, the plurality of burls 505a-505c can be made by etching holding device 503 using a mask. In this example, a mask is provided with the design and the pattern of the plurality of burls. This mask is then used to create the holding device 503 with the plurality of burls. However, it is noted that other fabrication procedures can also be used to create holding device 503 and the plurality of burls 505a-505c. As a non-limiting example, sand-blasting can also be used in creating the plurality of burls 505a-505c on holding device 503.

Figure 11:
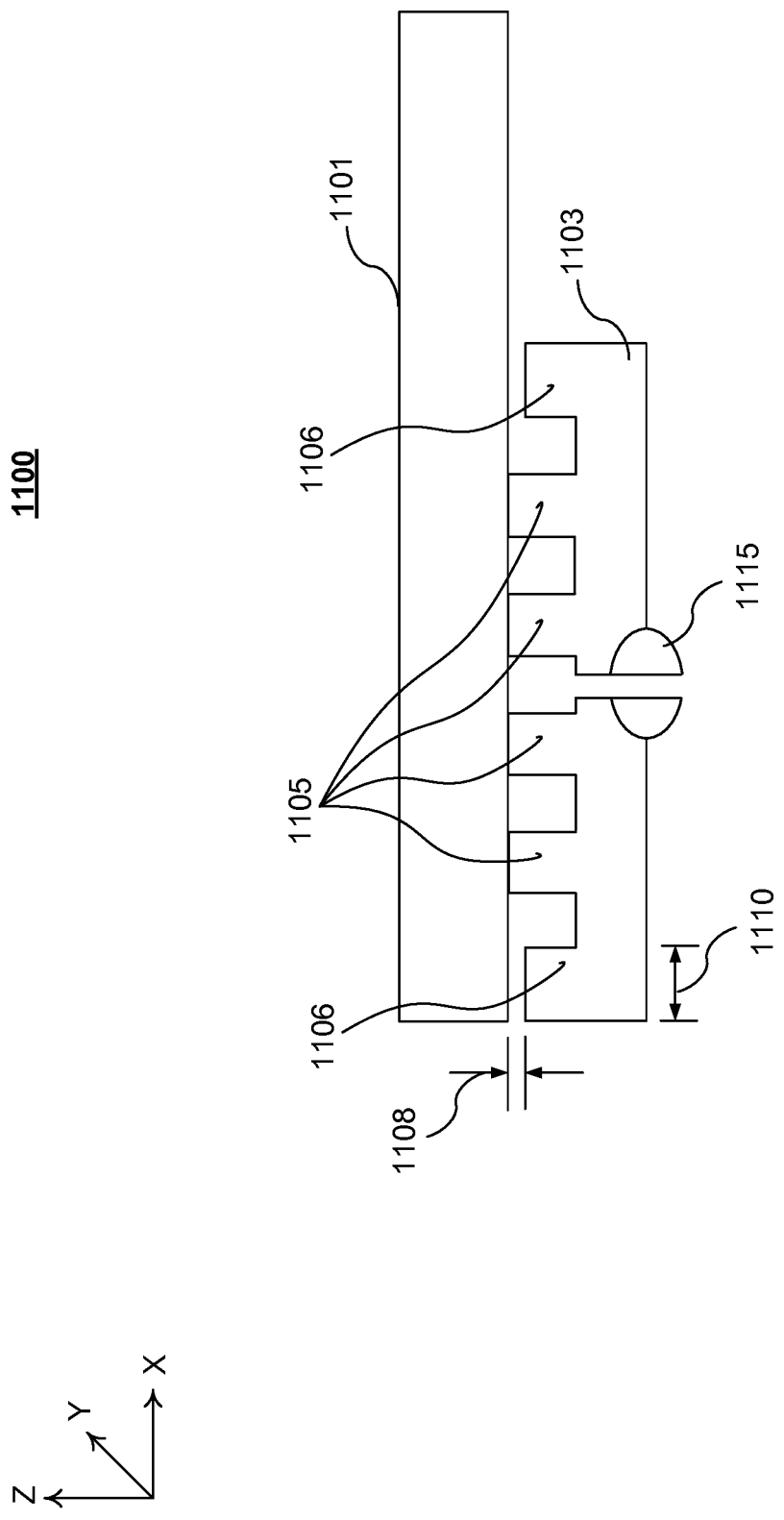
FIG. 11 is a schematic of a cross-sectional view of a reticle clamping system including a leaky seal, according to an embodiment of the disclosure.

According to some embodiments, holding device 503 can also include seals 506a and 506b (collectively seals 506) at the outer edges. In one example, seals 506 can be at two outer edges (along Y direction or X direction), at three outer edges, or all four outer edges of holding device 503. In some embodiments, seals 506 can include a continuous seal around the perimeter of holding device 503. However, the embodiments of this disclosure are not limited to this example. In this example, seals 506 have heights substantially the same as the plurality of burls 505a-505c. Accordingly, seals 506 can contact patterning device 501 when patterning device 501 is on the plurality of burls 505a-505c. FIG. 11, discussed in more detail below, illustrates a leaky seal.

In one example, each one of the plurality of burls 505a-505c can have a height of about 150 μm and a diameter of about 300 μm. According to some embodiments, the plurality of burls 505a-505c can have a burl pitch of about 3.87 mm (in X direction) and about 2.96 mm (in Y direction.) However, it is noted that the plurality of burls 505a-505c can have other heights, diameters, and/or burl pitches.

Additionally or alternatively, reticle clamping system 500 can include a support system 515. Support system 515 provides support in the Z direction for holding device 503 and patterning device 501. In one example, the use of support system 515 (instead of or in addition to an adhesive) can provide the Z direction support function for patterning device 501 with a nominally zero hysteresis and XY stiffness because a second coupling using an adhesive between first and second support device portions 507 and 511 has been eliminated. Elimination of the adhesive coupling also eliminates the associated elastic deformation and damping characteristics of the adhesive. In one example, the displacements in X and/or Y directions can be adsorbed by support system 515, which has a lower stiffness in XY direction, higher in Z direction (with respect to an adhesive), and nominally zero hysteresis or visco-elastic behavior. In some embodiments, the support system 515 can be coupled with the reticle clamping system 500 using adhesive (e.g., stiff Araldite® 2030.)

According to some embodiments, support system 515 can have a low stiffness in the X and Y directions compared to the stiffness of first support device portion 507 in the X and Y directions. In one example, the stiffness of support system 515 (in the X and Y directions) can be about an order of magnitude (e.g., less than about 10%-15%) less than the stiffness of first support device portion 507 (in the X and Y directions). Additionally or alternatively, support system 515 is configured to demonstrate no hysteresis behaviour or nominally zero (e.g., about 0.5%) hysteresis behaviour. Such hysteresis can occur during the acceleration and deceleration portions of the scan when the Z supports, attached to a clamp with adhesive is subject to XY shearing forces where the adhesive, while stiff, exhibits some amount of flexibility and hysteresis in the XY directions.

According to some embodiments, support system 515 can include a metallic support system. For example, support system 515 can include metallic flexures that have a stiffness in Z direction similar to the stiffness of an adhesive while it can have stiffness in XY plane reduced by about more than 50%. Compared to adhesives, support system 515 can be much softer and flexible to compensate for in plane hysteresis and drift. Additionally or alternatively, the out of plane drifts can be improved by designing support system 515 so that it has "feet" contacting support transport device 519 and/or holding device 503 making any adhesive layer affecting patterning device 501 Z position more deterministic.

According to some embodiments, support device 515 can include a pillar 525 and a holder 527. It is noted that although some exemplary designs for support device 515 are provided, the embodiments of this disclosure are not limited to these designs. Alternative designs for support device 515 that can provide the stated stiffness can also be used. For example, a support system that is compliant in X and Y directions and is relatively stiff in Z direction can be used. This support system can provide a better controlled thickness in the layers relevant for the positioning in the Z direction of the patterning device. Pillar 525 and holder 527 are connected to each other at 529. In one example, pillar 525 and holder 527 can be coupled to each other at 529 using different means, such as, but not limited to, welding. Pillar 525 can be coupled to first support device portion 507 using any means such as, but not limited to, adhesive 531. Holder 527 can be coupled to support transport device 519 using any means such as, but not limited to, an adhesive. In one example, a layer of adhesive can be applied between the top surface of support transport device 519 and a bottom surface of holder 527. Accordingly, support system 515 is configured to support first support device portion 507 (and therefore, holding device 503) on second support device portion 511.

According to some embodiments, pillar 525 is configured to provide the flexure function discussed above. In this example, holder 527 is fixed to support transport device 519. Pillar 525 is coupled to holder 527 at one end (529). At the other end, pillar 525 can be configured to move in X and/or Y directions. In some embodiments, support system 515 or one or more parts of support system 515 (e.g., pillar 525 and/or holder 527) can be made from metal, such as but not limited to, titanium and/or alloys thereof. In some embodiments, pillar 525 can be made in the shape of a cylinder that has a vacuum hole/channel 535 inside. It is noted however, other material and/or shapes can be used to make support system 515. The length of pillar 525 along with the fact that pillar 525 can pivot around the connection 529, can provide the flexure function of pillar 525. According to one example, an inner diameter of vacuum channel 535 inside pillar 525, the length of pillar 525, and the thickness of the walls of pillar 525 can be optimized in view of manufacturing and process parameters in designing support system 515.

According to some embodiments, support system 515 can be coupled to a vacuum channel 521 in support transport device 519. Vacuum channel 521 of support transport device 519 can be coupled to a vacuum pump 550 in a manner that would be apparent to a person of ordinary skill in the art. When patterning device 501 is to be coupled with holding device 503 using vacuum, the pump (e.g., a vacuum pump 550) can remove the air between patterning device 501 and holding device 503 through vacuum channel 521 and support system 515. For example, pillar 525 of support system 515 can include vacuum channel 535 that will be coupled to vacuum channel 521 to remove the air from between patterning device 501 and holding device 503 such that holding device 503 can hold patterning device 501 (e.g., on the plurality of burls 505a-505c.) Accordingly, support system 515 can provide support of first support device portion 507 and provide the vacuum for holding patterning device 501 on holding device 503.

In an embodiment, holding device or system 503 can be a reticle clamp or pad to hold a reticle or mask and support transport device 519 can be a chuck for use in a lithographic system such as shown in FIGS. 1A and 1B.

FIGS. 6A and 6B illustrate schematics of top view of holding devices 603 and 643, according to an embodiment. In an example, holding devices 603 and 643 can be holding device 503 of reticle clamping system 500 of FIG. 5.

According to some embodiments, the reticle clamping system of this disclosure includes two holding devices. For example, holding device 603 is configured to hold one side of the patterning device and holding device 643 is configured to hold the other side of the patterning device opposite to the side held by holding device 603. Continuing with this example, holding device 603 includes the plurality of burls 605. As discussed above, the plurality of burls 605 can have a design and a pattern such that the plurality of burls can create a distributed, uniform and compliant layer at the contact surface between the patterning device and holding device 603. Further, the shape, the height, the size, and/or the stiffness of the plurality of burls 605 can be optimized to create a distributed, uniform and compliant layer at the contact surface. Further, holding device 603 can include an opening 615 where the support system (such as, but not limited to, support system 515 of FIG. 5, an adhesive, etc.) can be coupled to holding device 603. According to some embodiments, opening 615 can allow the support system (such as, but not limited to, support system 515 of FIG. 5, an adhesive, etc.) be coupled to holding device 603 to support holding device 603 and also to provide a channel for vacuum.

According to some embodiments, holding device 603 can also include seals 606 at the outer edges. In one example, seals 606 can be at two outer edges (along Y direction or X direction), at three outer edges, or all four outer edges of holding device 603. In some embodiments, seals 606 can include a continuous seal around the perimeter of holding device 603. However, the embodiments of this disclosure are not limited to this example. Also, the shape and location of seals 606 with respect to outer edges of holding device 603 are for illustrative purposes only, and can have various configurations. In this example, seals 606 have heights substantially the same as the plurality of burls 605. Alternatively, as discussed in more detail with respect to FIG. 11, one or more portions of seals 606 can include leaky seals that can be shorter in height in comparison to the plurality of burls 605.

Holding device 643 also includes the plurality of burls 645, seals 646, and openings 655a and 655b. At openings 655a and 655b the support system (such as, but not limited to, support system 515 of FIG. 5, an adhesive, etc.) can be coupled to holding device 643. According to some embodiments, openings 655a and 655b can allow the support system (such as, but not limited to, support system 515 of FIG. 5, an adhesive, etc.) be coupled to holding device 643 to support holding device 643 and also to provide a channel for vacuum. It is noted that although one opening is shown for holding device 603 and two openings are shown for holding device 643, the embodiments of this disclosure are not limited to these numbers and other number of openings can be used for each of the holding devices. According to some embodiments, seals 646 are similar to seals 606 and/or leaky seals 1106 discussed in more detail with respect to FIG. 11.

FIGS. 6A and 6B illustrate that openings 615, 655a, and 655b are located in place of a corresponding burl on holding devices 603 and 643. However, these locations of the openings are exemplary locations and the embodiments of this disclosure are not limited to these locations. For example, one or more of the openings 615, 655a, and 655b can be placed between the burls. According to some embodiments, the locations of the opening can be optimized such when holding device 603 and/or 643 hold the patterning device, a distributed and uniform vacuum can be created between the patterning device and holding devices 603 and 643. In one example, the distributed and uniform vacuum (with the use of the plurality of burls) can create a distributed, uniform and compliant layer at the contact surface between the patterning device and holding devices 603 and/or 643.

FIGS. 6C and 6D illustrate schematics of top view of second support device portions 611 and 651, according to an embodiment. In an example, second support device portions 611 and 651 can be second support device portion 511 of reticle support clamping 500 of FIG. 5.

In one example, second support device portion 611 of FIG. 6C corresponds to holding device 603 of FIG. 6A. Additionally, second support device portion 651 can correspond to holding device 643 of FIG. 6B. In other words, second support device portion 611 can hold holding device 603 through a first support device portions and a support system as shown, for example, in FIG. 5. According to some embodiments, second support device portion 611 includes an opening 612. Opening 612 can be used for placing a support system (such as, but not limited to, support system 515 of FIG. 5, an adhesive, etc.) In this example, opening 612 of second support device portion 611 can correspond to opening 615 of holding device 603.

According to some embodiments, second support device portion 651 includes an openings 652a and 652b. Openings 652a and 652b can be used for placing support systems (such as, but not limited to, support system 515 of FIG. 5, an adhesive, etc.) In this example, openings 652a and 652b of second support device portion 651 can correspond to openings 655a and 655b of holding device 643.

It is noted that although one opening is shown for second support device portion 611 and two openings are shown for second support device portion 651, the embodiments of this disclosure are not limited to these numbers and other number of openings can be used for each of the holding devices. Also, FIGS. 6C and 6D illustrate that openings 612, 652a, and 652b are located at one edge of second support device portions 611 and 651. However, these locations of the openings are exemplary locations and the embodiments of this disclosure are not limited to these locations.

Continuing with this example, three support systems (such as, but not limited to, support system 515) can be used with the reticle clamping system of this disclosure. In one example, each of the three support systems can be used to support its respective first support device portions and/or the holding devices. In addition, each of the support systems can be used to provide a vacuum environment for holding the patterning device to the holding devices. By using the three support systems, the symmetry of the provided vacuum environment can be improved. In one example, all of the three support systems can be coupled to one vacuum pump that provides the vacuum environment for holding the patterning device to the holding device. Alternatively, each of the three support systems can be coupled to its respective vacuum pump that provide the vacuum environment for holding the patterning device to the holding device. Additionally or alternatively, two of the three support systems can be coupled to a first vacuum pump and the other support system can coupled to a second vacuum pump.

In some embodiments, three support systems (such as, but not limited to, support system 515) can be used with the reticle clamping system of this disclosure. In one example, two or three of the support can have substantially same stiffness in Z-direction.

It is noted that the embodiments of this disclosure can include one or more of the designs discussed above. For example, some of the embodiments can include the holding device with the plurality of burls but with different support system than the metallic flexure discussed above. In some embodiments, a holding device without the plurality of burls can be used with the metallic flexure support system discussed above. In some embodiments, not all the support systems provide a vacuum environment between the patterning device and the holding device. In some embodiments, a combination of one or more of the designs can be used for the reticle clamping system.

FIGS. 7A, 7B, 8A, 8B, 9A, and 9B illustrate exemplary implementations of a support system, according to an embodiment. In an example, this support system can be used as one design of support system 515 of reticle clamping system 500 of FIG. 5.

Figure 7A:
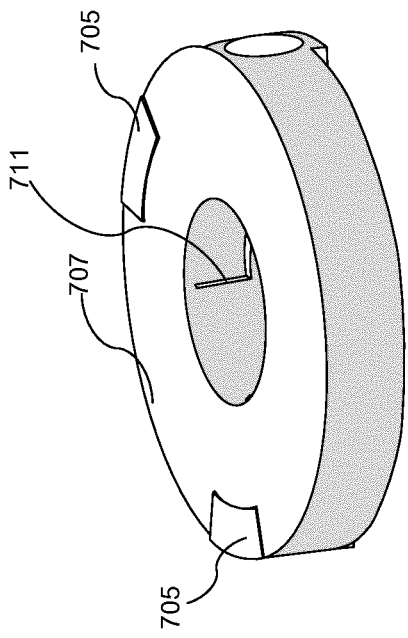
FIGS. 7A and 7B are schematics of top view and bottom view, respectively, of an outer ring, according to an embodiment of the disclosure.
Figure 7B:
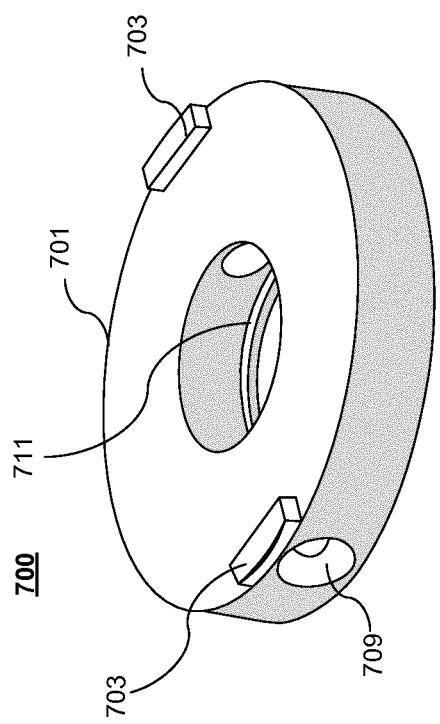

FIGS. 7A and 7B illustrate schematics of top view and bottom view, respectively, of outer ring 700, according to one embodiment. In some embodiments, outer ring 700 is one part of the support system and can be used to couple the support system to the support transport device (e.g., support transport device 519 of FIG. 5 such as, but not limited to, a chuck), to allow adjustments in Z direction, and/or to seal the vacuum environment.

In one example, outer ring 700 can include pins 703 on body 701. Pins 703 can be used to couple outer ring 700 to a holder discussed below. In some embodiments, the holder can be welded to outer ring 700 at pins 703. Further, pins 703 can create the gap needed for adjustment in Z direction.

Additionally or alternatively, outer ring 700 can include feet 705. In one example, feet 705 can be used to contact the support transport device, such as support transport device 519 of FIG. 5 (such as, but not limited to, a chuck.) In one example, an adhesive can be used to couple the bottom surface 707 of outer ring 700 and feet 705 to the support transport device, such as support transport device 519 of FIG. 5 (such as, but not limited to, a chuck.) Adhesive shrinkage during curing and pressure during Z adjustment can make feet 705 contact the support transport device. In one example, adhesive material can be used to couple the outer ring 700 (and therefore, the support system) to the support transport device and also to seal the vacuum. It is noted that in addition to or in place of an adhesive, other bonding techniques can also be used.

Outer ring 700 can include openings (e.g., holes) 709. In one example, openings 709 can be used to insert an adhesive inside outer ring 700 to couple outer ring 700 to the holder, as discussed below. In some embodiments, outer ring 700 can include a channel 711 so that the adhesive can follow to other end of outer ring 700 and to keep the adhesive in the inside part of outer ring 700. The shapes of opening 709 and channel 711 are for illustrative purposes only, and can have various configurations.

Figure 8A:
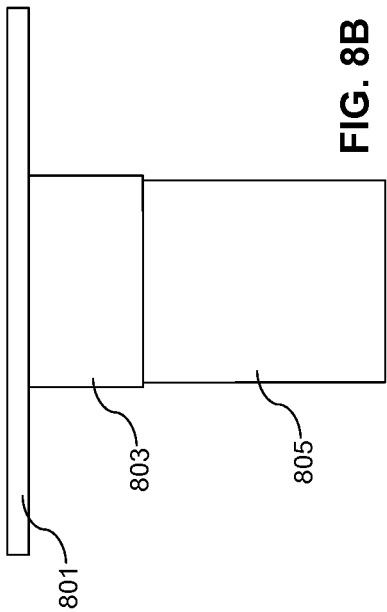
FIGS. 8A and 8B are schematics of top view and side view, respectively, of a holder, according to an embodiment of the disclosure.
Figure 8B:
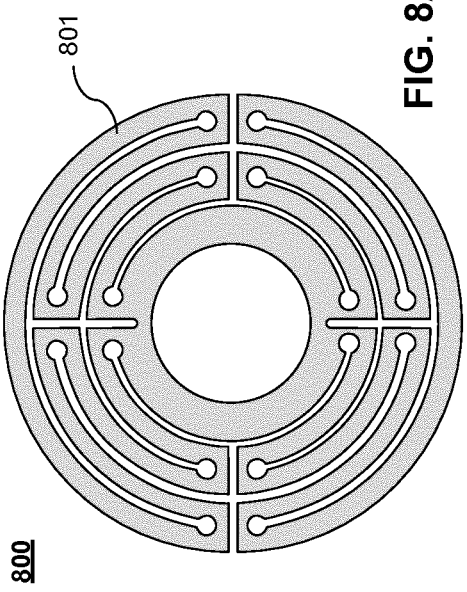

FIGS. 8A and 8B illustrate schematics of top view and side view, respectively, of holder 800, according to one embodiment. In some embodiments, holder 800 is one part of the support system and can be used to couple a pillar (as discussed below) to outer ring 700, to allow adjustments in Z direction, and/or to seal the vacuum environment.

In some embodiments, holder 800 can include spring 801. Spring 801 can be a spring in the Z direction and can be configured to push down on outer ring 700 during position adjustment in Z direction. In one example, spring 801 of holder 800 can be connected to the outer ring 700 on pins 703 of outer ring 700. For example, an adhesive can be used to connect spring 801 to pins 703. Additionally or alternatively, spring 801 of holder 800 can be welded to the outer ring 700 on pins 703 of outer ring 700. The shapes of spring 801 are for illustrative purposes only, and can have various configurations.

In one example, holder 800 can include a first portion 803 and a second portion 805. According to some embodiments, first and second portions 803 and 805 can be in the shape of a cylinder. However, first and second portions 803 and 805 can be designed to have other shapes. Continuing with this example, the second portion 805 has a smaller radius than the first portion 803. In some embodiments, outer ring 700 can be coupled to holder 800 at the first portion 803. For example, an adhesive can be used to connect first portion 803 of holder 800 to outer ring 700. As discussed above, opening 709 and channel 711 of outer ring 700 can be used to insert the adhesive to couple first portion 803 of holder 800 to outer ring 700.

Additionally or alternatively, second portion 805 of holder 800 can be used to couple holder 800 to the pillar (discussed below). In one example, pillar is located through holder 800 and inside of second portion 805 is connected to the pillar. In one example, the pillar can be welded to the inside of second portion 805.

According to this exemplary design of the support system, outer ring 700 of FIGS. 7A and 7B is coupled to the support transport device (e.g., support transport device 519 such as, but not limited to, a chuck) and holder 800 of FIGS. 8A and 8B is coupled to outer ring 700. As discussed next, a pillar is coupled to holder 800 on one end and is coupled to the first support device portion (e.g., first support device portion 507 of FIG. 5.)

Figure 9B:
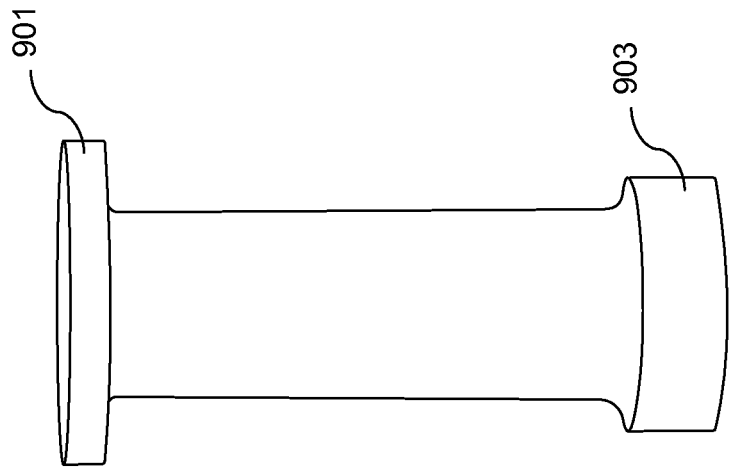
FIGS. 9A and 9B are schematics of side views of a pillar, according to an embodiment of the disclosure.
Figure 9A:
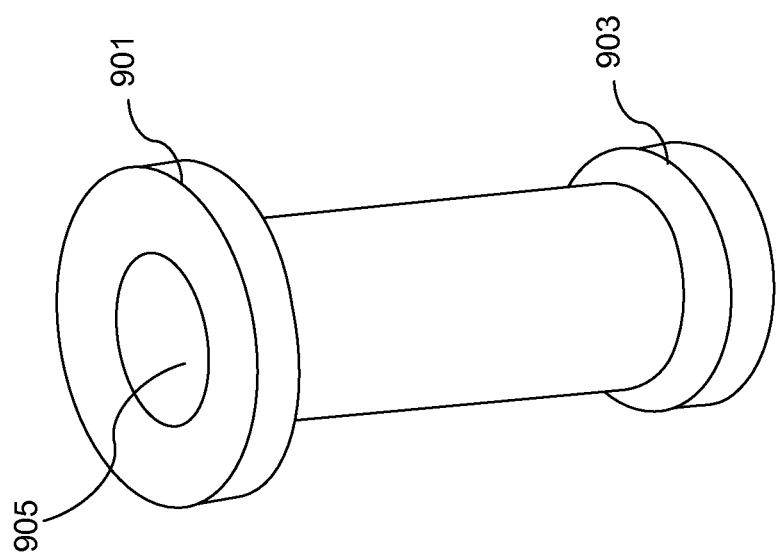

FIGS. 9A and 9B illustrate schematics of top-side view and side view, respectively, of pillar 900, according to one embodiment. In some embodiments, pillar 900 is one part of the support system and can provide the flexure functionality of the support system. According to some embodiments, pillar 900 is configured to provide the flexure function discussed above. In this example, pillar 900 is coupled to holder 800 at one end. At the other end, pillar 900 can be configured to move in XY direction.

In one example, pillar 900 includes top portion 901. Top portion 901 can be coupled to the first support device portion (e.g., first support device portion 507 of FIG. 5.) In some embodiments, adhesive material can be used to connect top portion 901 to the first support device portion. As a non-limiting example, a 5-50 µm, 10-30 µm, or about 20 µm controlled thickness layer of adhesive can be used. It is noted that in addition to or in place of an adhesive, other bonding techniques can also be used.

Pillar 900 is configured to be inserted through holder 800. A bottom portion 903 of pillar 900 is connected to second portion 805 of holder 800 inside of holder 800. Further, pillar 900 includes a vacuum channel 905, which is used to provide the vacuum environment between the holding device and the patterning device.

It is noted that a support system including outer ring 700, holder 800, and pillar 900 is one exemplary embodiment of the design of the support system of this disclosure and other support systems, such as support system 515 discussed above can also be used.

In one example, one or more of outer ring 700, holder 800, and pillar 900 can be made from metals such as, but not limited to, titanium and/or alloys thereof. However, one or more of outer ring 700, holder 800, and pillar 900 can be made of and/or include other materials too.

Figure 10B:
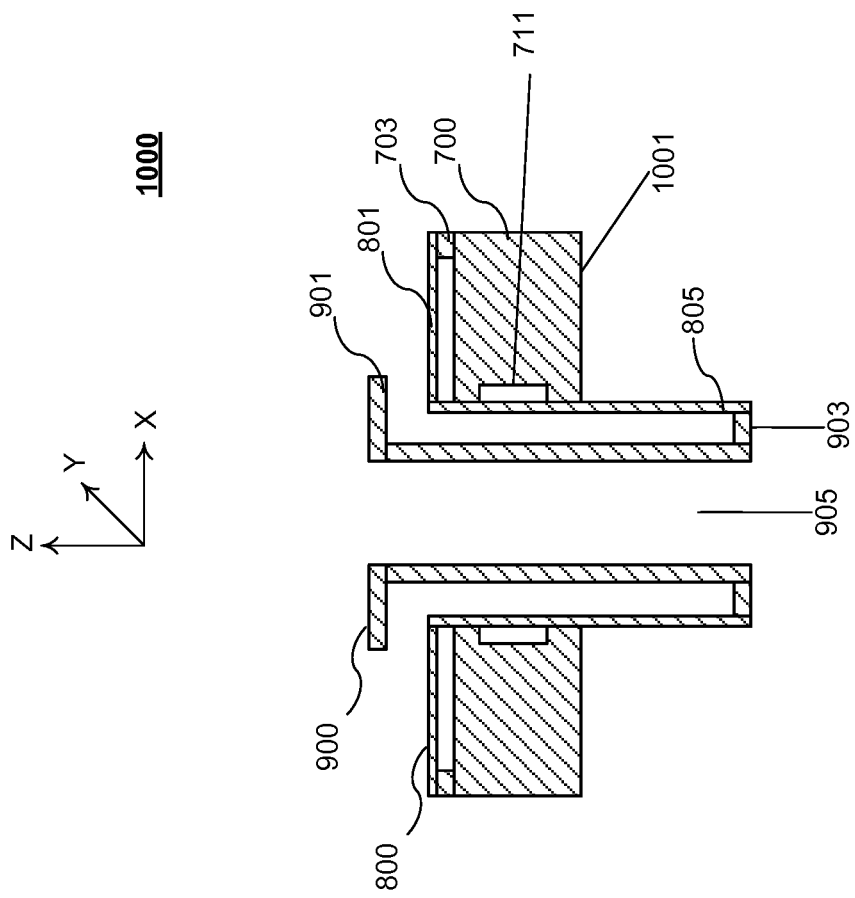
FIG. 10B is a schematic of the side view of a support system that includes an outer ring, a holder, and a pillar, according to an embodiment of the disclosure.
Figure 10A:
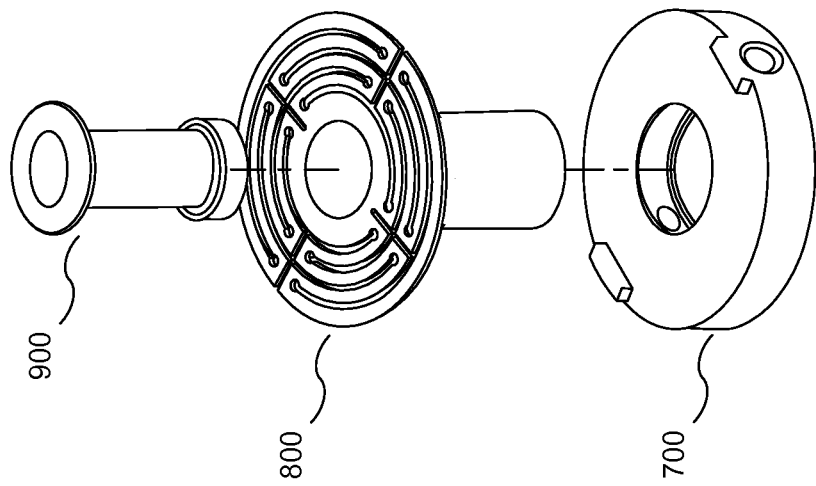
FIG. 10A is a schematic of a support system that combines an outer ring, a holder, and a pillar, according to an embodiment of the disclosure.

FIG. 10A illustrates a schematic of a support system that combines outer ring 700, holder 800, and pillar 900, according to one embodiment. In one embodiment, to assemble the support system to the reticle support system, first pillar 900 can be positioned and be connected (e.g. using an adhesive) to the bottom of the first support device portion (e.g., first support device portion 507 of FIG. 5.) If adhesive is used, then the adhesive can be cured. Next, outer ring 700 can be connected (e.g. using an adhesive) to holder 800 and outer ring 700 can be connected (e.g. using an adhesive) to the support transport device (e.g., support transport device 519). Next, the support system (e.g., including outer ring 700, holder 800, and pillar 900) can be inserted in a hole in the support transport device (e.g., in vacuum channel 521). In one example, when feet 705 on the bottom of the outer ring 700 are contacting the support transport device (e.g., the chuck), the support system can be about 50-200 µm above a desired Z height. This extra height can create the Z force pushing the bottom feet 705 against the support transport device (e.g., the chuck) during the cure phase. Then the position of the support system can be adjusted in XY direction. In one example, and while the adhesive is not cured the holder 800 can still slide in Z direction relative to the outer ring 700. While adjusting the reticle supporting system in Z direction, spring 801 of holder 800 can push on outer ring 700—pressure brings feet 705 of outer ring 700 in contact with support transport device (e.g., the chuck.) Next, the outer ring-holder and outer ring-chuck adhesive is cured.

FIG. 10B illustrates a schematic of side view of a support system 1000 that includes outer ring 700, holder 800, and pillar 900, according to one embodiment. In an example, support system 1000 can be used as one design of support system 515 of reticle clamping system 500 of FIG. 5.

As illustrated in FIG. 10B, support system 1000 includes outer ring 700. Outer ring 700 is configured to support the support system 1000 on the support transport device (e.g., support transport device 519 such as, but not limited to, a chuck) at surface 1001. Additionally, outer ring 700 can include pins 703. Pins 703 can be used to couple outer ring 700 to holder 800. Outer ring 700 can also include channel 711 so that an adhesive (for connecting outer ring 700 to holder 800) can follow to other end of outer ring 700. Although not shown, outer ring 700 can include an opening (e.g., a hole) and one or more feet as discussed above.

Support system 1000 can also include holder 800. In some embodiments, holder 800 is one part of support system 1000 and can be used to couple pillar 900 to outer ring 700, to allow adjustments in Z direction, and/or to seal the vacuum environment. Holder 800 can include spring 801. Spring 801 can be connected to the outer ring 700 on pins 703 of outer ring 700. Holder 800 can also include second portion 805, which can be used to couple holder 800 to pillar 900. In one example, pillar 900 is located through holder 800 and inside of second portion 805 is connected to pillar 900.

Support system 1000 further includes pillar 900. Pillar 901 can have a top portion 901, a bottom portion 903, and a vacuum channel 905. Top portion 901 can be coupled to the first support device portion (e.g., first support device portion 507 of FIG. 5.) Bottom portion 903 of pillar 900 can be connected to second portion 805 of holder 800 inside of holder 800. Vacuum channel 905 can be used to provide the vacuum environment between the holding device and the patterning device.

FIG. 11 illustrates a schematic of a cross-sectional view of a reticle clamping system 1100 including a leaky seal, according to an embodiment.

FIG. 11 illustrates a holding device 1103 to hold patterning device 1101, and a support system 1115. Although not shown, reticle clamping system 1100 can include a support device including first and second support device portions, a support transport device, and adhesives as shown in, for example, FIG. 5. Further, support system 1115 can include any support system discussed in this disclosure and/or any support system for providing support in the Z direction for holding device 1103 and patterning device 1101.

According to some embodiments, holding device 1103 of reticle clamping system 1100 can include a plurality of burls 1105. In one example, patterning device 1101 is coupled to the plurality of burls 1105 of holding device 1103, which is configured to releasably hold patterning device 1101 using vacuum. Although only four burls are shown in FIG. 11, it is noted that the plurality of burls 1105 can include any number of burls. In some embodiments, using the plurality of burls 1105 can improve shear stress uniformity. In one example, the plurality of burls 1105 can have a design and a pattern such that the plurality of burls can create a distributed, uniform and compliant layer at the contact surface between patterning device 1101 and holding device 1103. Further, the height, the size, and/or the stiffness of the plurality of burls 1105 can be optimized to create a distributed, uniform and compliant layer at the contact surface. According to some embodiments, the plurality of burls 1105 can be made by etching holding device 1103 using a mask. However, it is noted that other fabrication procedures can also be used to create holding device 1103 and the plurality of burls 1105.

According to some embodiments, holding device 1103 can also include leaky seals 1106 at the outer edges. In one example, leaky seals 1106 can be at two outer edges (along Y direction or X direction), at three outer edges, or all four outer edges of holding device 1103. In some embodiments, seals 1106 can include a continuous seal around the perimeter of holding device 1103. However, the embodiments of this disclosure are not limited to this example. In this example, leaky seals 1106 are shorter in height in comparison to the plurality of burls 1105. Accordingly, leaky seals 1106 do not contact patterning device 1101 when patterning device 1101 is on the plurality of burls 1105. According to one embodiment, by using leaky seals 1106, a gap 1108 is created between patterning device 1101 and leaky seals 1106. As a non-limiting example, gap 1108 can be about 1-5 µm (e.g., 3 µm). Also, as a non-limiting example, each of the leaky seals 1106 can have a width 1110 of about 0.1-1 mm (e.g., 0.5 mm). However, it is noted that other values for gap 1108 and/or width 1110 can also be used.

In one example, by using leaky seals 1106, small amount of air can flow from outside to the surface between patterning device 1101 and holding device 1103 (and to the vacuum channel in the support system 1115). However, using leaky seals 1106 can improve the stress and the distributed, uniform and compliant layer at the contact surface between patterning device 1101 and holding device 1103. Also, gap 1108 can be designed such that the vacuum between patterning device 1101 and holding device 1103 can be maintained at about, for example, 99% of the case where no gap exists.

The term "about" as used herein indicates the value of a given quantity varies by ±10% of the value, unless noted otherwise.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

While specific embodiments of the disclosure have been described above, it will be appreciated that the disclosure may be practiced otherwise than as described. The description is not intended to limit the disclosure.

It is to be appreciated that the Detailed Description section, and not the Summary and Abstract sections, is intended to be used to interpret the claims. The Summary and Abstract sections may set forth one or more but not all exemplary embodiments of the present disclosure as contemplated by the inventor(s), and thus, are not intended to limit the present disclosure and the appended claims in any way.

The present disclosure has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein.

The breadth and scope of the present disclosure should not be limited by any of the above-described exemplary embodiments, but should be defined only in accordance with the following claims and their equivalents.

What is claimed is:

1. A reticle clamping system, comprising:
   a support device;
   a holding device configured to releasably couple a reticle to the support device, wherein the holding device comprises a plurality of burls; and
   a metallic support system coupled to the support device and configured to provide a vacuum path from a vacuum channel to the holding device,
   wherein the metallic support system comprises a holder and a pillar inserted through the holder and coupled to the holder.

2. The reticle clamping system of claim 1, wherein the support device comprises:
   a first support device portion coupled to the holding device; and
   a second support device portion coupled to first support device portion.

3. The reticle clamping system of claim 2, further comprising:
   a support transport device coupled to the second support device portion,
   wherein the second support device portion comprises the vacuum channel, and
   wherein the holder is coupled to the support transport device and the pillar is coupled to the first supporting device portion.

4. The reticle clamping system of claim 1, further comprising:
   a second holding device configured to releasably couple the reticle to a second support device, wherein the second holding device comprises a second plurality of burls.

5. The reticle clamping system of claim 4, further comprising:
   a second metallic support system coupled to the second support device and configured to provide a vacuum path to the second holding device.

6. The reticle clamping system of claim 5, further comprising:
   a third metallic support system coupled to the second support device, wherein the third metallic support system is spaced apart from the second metallic support system and each one of the second and third metallic support systems is configured to provide the vacuum path to the second holding device.

7. The reticle clamping system of claim 1, wherein the metallic support system further comprises a ring coupled to the holder.

8. The reticle clamping system of claim 1, wherein the plurality of burls are distributed in two directions.

9. The reticle clamping system of claim 1, wherein the holding device further comprises a seal located at edges of the holding device.

10. The reticle clamping system of claim 9, wherein a height of the seal is less than a height of the plurality of burls such that when the reticle touches a top surface of the plurality of burls, the reticle does not touch a top surface of the seal.

11. The reticle clamping system of claim 1, wherein the metallic support system comprises a non-metallic material.

12. A lithographic apparatus comprising:
    an illumination system configured to illuminate a pattern of a patterning device;
    a projection system configured to project an image of the pattern on to a target portion of a substrate; and
    a patterning device clamping system, comprising:
       a support device;
       a holding device configured to releasably couple a patterning device to the support device, wherein the holding device comprises a plurality of burls distributed in two directions; and
       a metallic support system coupled to the support device and configured to provide a vacuum path from a vacuum channel to the holding device,
       wherein the metallic support system comprises a holder and a pillar inserted through the holder and coupled to the holder.

13. The lithographic apparatus of claim 12, wherein the patterning device clamping system further comprising:
    a second holding device configured to releasably couple the patterning device to a second support device, wherein the second holding device comprises a second plurality of burls.

14. The lithographic apparatus of claim 13, wherein the patterning device clamping system further comprising:
    a second metallic support system coupled to the second support device and configured to provide a vacuum path to the second holding device.

15. The lithographic apparatus of claim 14, wherein the patterning device clamping system further comprising:
    a third metallic support system coupled to the second support device, wherein the third metallic support system is spaced apart from the second metallic support system and each one of the second and third metallic support systems is configured to provide the vacuum path to the second holding device.

16. The lithographic apparatus of claim 12, wherein the holding device further comprises a seal located at edges of the holding device.

17. The lithographic apparatus of claim 16, wherein a height of the seal is less than a height of the plurality of burls such that when the reticle touches a top surface of the plurality of burls, the reticle does not touch a top surface of the seal.

18. The lithographic apparatus of claim 12, wherein the metallic support system comprises a non-metallic material.

19. A method for supporting a patterning device, the method comprising:
    holding the patterning device using a plurality of burls on a holding device;
    supporting the holding device using a support device; and
    providing a vacuum path from a vacuum channel to the holding device through a metallic support system, wherein the metallic support system comprises a holder and a pillar inserted through the holder and coupled to the holder.

20. The method of claim 19, further comprising:
    holding the patterning device using a second plurality of burls of a second holding device; and
    providing a vacuum path to the second holding device using a second metallic support system.

* * * * *